United States Patent [19]

Goetzberger et al.

[11] 3,915,755

[45] Oct. 28, 1975

[54] METHOD FOR DOPING AN INSULATING LAYER

[75] Inventors: Adolf Goetzberger, Merzhausen; Walter Kellner, Munich, both of Germany

[73] Assignee: Siemens Aktiengesellschaft, Berlin & Munich, Germany

[22] Filed: Jan. 31, 1974

[21] Appl. No.: 438,459

[30] Foreign Application Priority Data

Feb. 22, 1973 Germany ............................ 2308803

[52] U.S. Cl. ............................................ 148/1.5 CP

[51] Int. Cl.².......................................... H01L 19/00

[58] Field of Search...................................... 148/1.5

[56] References Cited

UNITED STATES PATENTS 3,660,735 5/1972 McDougall .......................... 148/1.5

*Primary Examiner*—Peter D. Rosenberg

*Attorney, Agent, or Firm*—Hill, Gross, Simpson, Van Santen, Steadman, Chiara & Simpson

[57] ABSTRACT

Method for doping a first insulating layer, such as a silicon dioxide layer, located on a semiconductor body which comprises covering the exposed surfaces of the first insulating layer with a second insulating layer such as silicon nitride and then implanting a dopant in the first insulating layer by ion implantation through the second insulating layer.

8 Claims, 3 Drawing Figures

METHOD FOR DOPING AN INSULATING LAYER

BACKGROUND OF THE INVENTION

1. Field of the Invention

This invention is in the field of manufacturing semiconductor devices, such as silicon planar transistors by ion implantation into a layer of insulating material such as silicon dioxide which is completely enclosed by means of a second insulating layer composed, for example, of silicon nitride.

2. Description of the Prior Art

It is well known that silicon planar transistors when subjected to a temperature in excess of 500°C in an inert or oxidizing atmosphere do not exhibit maximum current amplification at a low collector current. The desired high current amplification at a low collector current can be achieved by a temperature treatment in the range between 350°C and 550°C in an atmosphere containing hydrogen or water vapor. The result of this type of treatment is that the surface recombination at the pn-junction between the emitter zone and the base zone of the transistor at the boundary between the silicon body and the silicon dioxide layer which covers the silicon body is reduced. Accordingly, the current amplification rises at a low collector current.

In order to protect the silicon dioxide from ions which possess a high degree of mobility in the silicon dioxide, particularly sodium ions, frequently a silicon nitride layer is applied to the silicon dioxide layer. The protection provided by the silicon nitride layer is effective only when the silicon nitride layer covers all of the silicon dioxide layer, including the edges of the layer.

Protected transistors of this type are very difficult to produce since in coating with the silicon nitride layer, a high deposition temperature on the order of 850°C causes a reduction in the current amplification at a low collector current and since in this type of transistor the usual temperature treatment is not effective in reducing the surface recombination.

German application AS 2,115,567 describes a method for incorporating a dopant into silicon dioxide layers on a silicon semiconductor by means of ion implantation and subsequent thermal oxidation of the surface characterized in that the layer containing the ions is converted completely throughout its entire depth to silicon dioxide.

SUMMARY OF THE INVENTION

The present invention provides a method which permits the doping of a first insulation layer which is covered by an additional insulating layer of different composition, the first insulating layer being protected from the penetration of ions in order to produce a semiconductor component having a considerably better stability in relation to thermal or electric loads. With the method of the present invention, it is possible to influence the electric properties of the semiconductor body and of the boundary between the semiconductor body and the insulating layer in spite of the additional insulating layer arranged over the first insulating layer.

With the use of the method of the present invention, the electric properties of the semiconductor body and/or of the boundary between the semiconductor body and the insulating layer can be influenced by additional temperature treatment, using a temperature such that diffusion of the implanted dopant is prevented. The first insulating layer, usually silicon dioxide, is entirely enclosed by the second insulating layer and by the semiconductor body. The second insulating layer, such as silicon nitride, and the semiconductor body act as diffusion barriers for a specific dopant which is introduced into the first insulating layer in order to influence the electric properties of the semiconductor body and/or the boundary between the semiconductor body and the first insulating layer. The method of the present invention thus is capable of producing well protected transistors which have a high current amplification at a low collector current.

BRIEF DESCRIPTION OF THE DRAWINGS

A preferred embodiment of the present invention will be explained in detail in connection with the accompanying drawings, in which.

DESCRIPTION OF THE PREFERRED EMBODIMENTS

Figure 1:
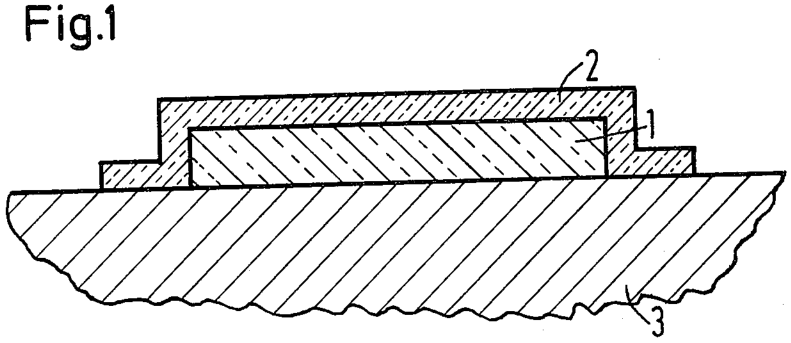
FIG. 1 illustrates a semiconductor body with two insulating layers.

In FIG. 1, there is shown a silicon dioxide layer 1 arranged on a semiconductor body 3, and a silicon nitride layer 2 which completely encloses the exposed surfaces of the silicon dioxide layer 1 and overlaps the silicon dioxide layer at its edges by approximately 10 microns. The silicon dioxide layer 1 is thus entirely surrounded by the semiconductor body 3 and by the silicon nitride layer 2. The silicon nitride layer 2 and the semiconductor body 1 act as a diffusion barrier for a specific element or a specific dopant which is to be introduced into the silicon dioxide layer 1 in order to influence the electric properties of the semiconductor body 3 and/or of the boundary between the silicon dioxide layer 1 and the semiconductor body 3.

In accordance with the present invention, the desired dopant is introduced into the silicon dioxide layer 1 by ion implantation. Devices for ion implantation in semiconductor device manufacture are well known in the art, and some are described in the October 1971 edition of "Solid State Technology", pages 46 to 50. The hydrogen ions are shot through the silicon nitride layer 2 into the silicon dioxide layer 1. The electric properties of the semiconductor body 3 and/or of the boundary area between the semiconductor body 3 and the silicon dioxide layer 1 can be further influenced by an additional temperature treatment in which the temperature is such that the silicon nitride layer 2 retains its property of preventing the diffusion of the implanted element. Temperatures of about 400 to 500°C are suitable for this step.

Figure 2:
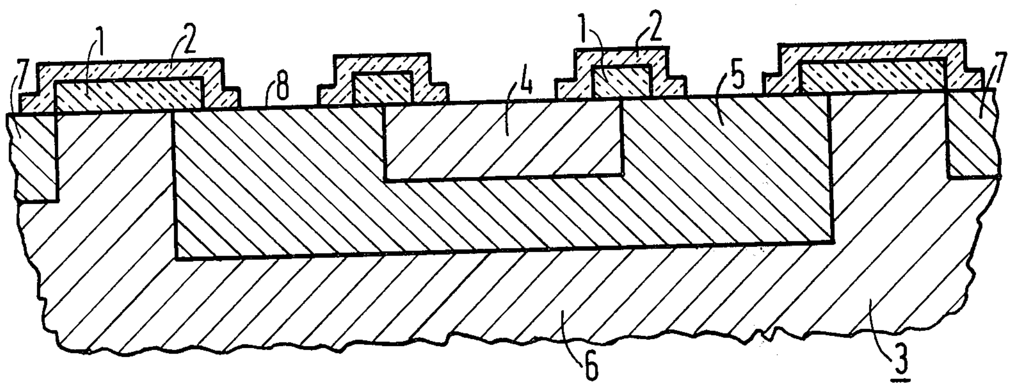
FIG. 2 illustrates a planar transistor produced by the method of the present invention with a silicon dioxide layer which is fully protected by a silicon nitride layer.

FIG. 2 illustrates a silicon planar transistor produced by the method of the present invention, with a silicon dioxide layer which is fully protected by a silicon nitride layer. This figure illustrates a semiconductor body 3 which is, for example, n-doped and provided with an n-doped emitter zone 4, a p-doped base zone 5, and n-doped collector zone 6 and an n-doped guard ring 7 which surrounds the collector zone 6 in spaced relation thereto. The pn-junctions which appear at the surface 8 of the semiconductor body 3 and which occur between the emitter zone 4 and the base zone 5, and between the base zone 5 and a collector zone 6 are protected by oxide layers 1. These oxide layers 1 are entirely surrounded by the combination of the semiconductor body 3 and by silicon nitride layers 2. In accordance with the present invention, hydrogen ions are implanted into the silicon dioxide layers 1 in the manner explained in connection with FIG. 1.

Figure 3:
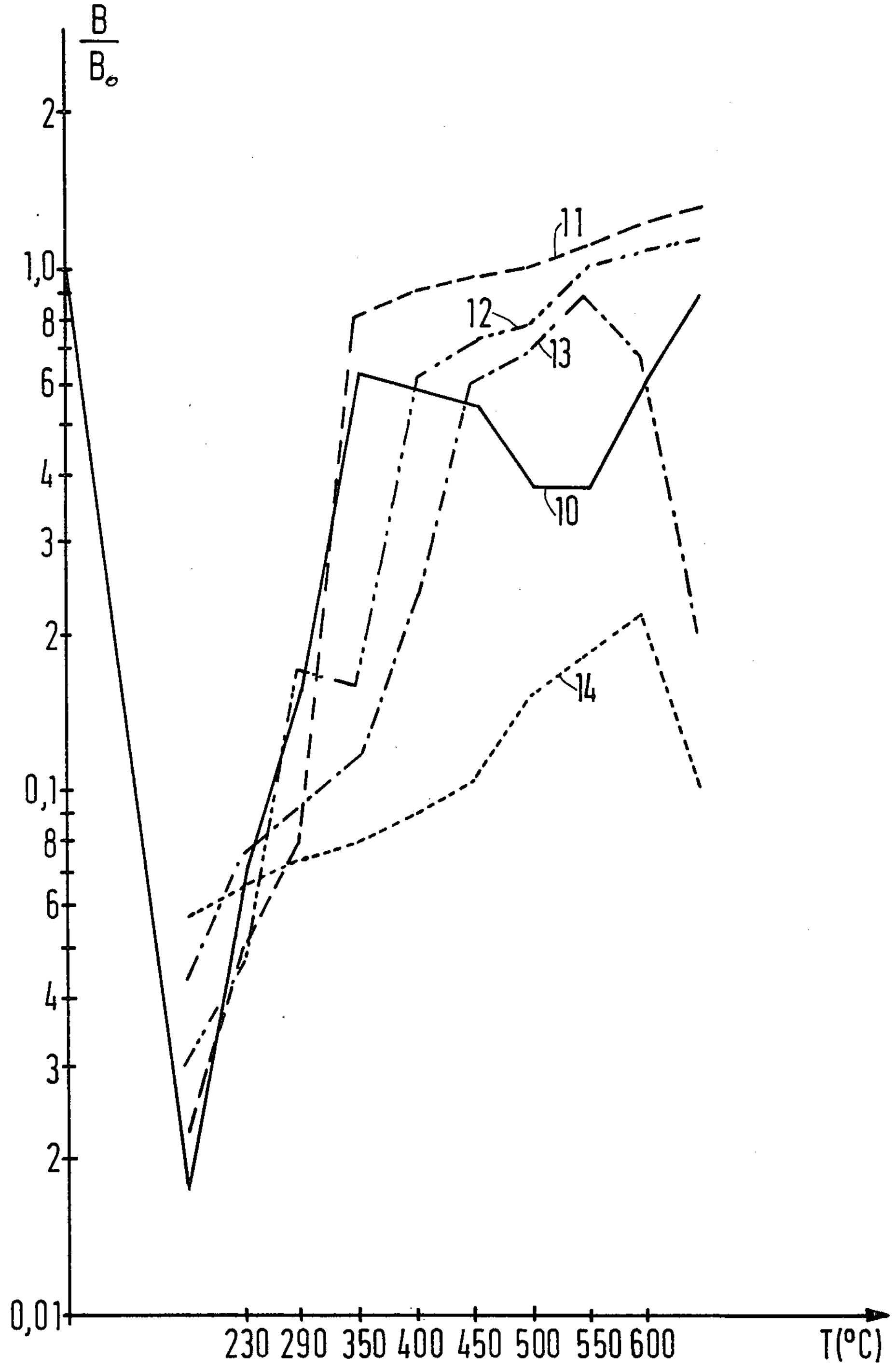
FIG. 3 is a series of graphs illustrating the ratio of the current amplification B after the coating of a silicon dioxide layer with a silicon nitride layer to the current amplification $B_0$ prior to this coating, depending upon the various processing steps, the different curves representing various concentration of hydrogen ions implanted in the silicon dioxide layer.

FIG. 3 shows the current amplification B relative to the original value $B_0$ prior to the coating with the silicon nitride layer 2, measured with a collector current $I_c$ of 0.1 mA, and with a collector voltage $V_{ce}$ of 5 volts after the various treatment steps of the method in accordance with the present invention, depending upon the temperature T.

After coating with the silicon nitride layer 2, the expected drop in current amplification is established. Then hydrogen ions are implanted, the ions being shot through the silicon nitride layer 2 in such a manner that the expected maximum of the hydrogen ion distribution lies approximately in the center of the silicon dioxide layer 1.

Curve 10 illustrates a concentration of $10^{16}$ atoms per square centimeter, curve 11 illustrates a concentration of $3 \cdot 10^{15}$ atoms per square centimeter, curve 12 refers to a concentration of $5 \cdot 10^{14}$ atoms per square centimeter, curve 13 refers to a concentration of $7 \cdot 10^{13}$ atoms per square centimeter and curve 14 refers to a concentration of $10^{13}$ atoms per square centimeter.

The thickness of the silicon nitride layer 2 usually amounts to about 1,200 Angstroms and the thickness of the silicon dioxide layer 1 is usually on the order of 6,000 Angstroms. The desired distribution of hydrogen ions can be achieved under these conditions with an energy value of approximately 70keV.

It will be seen from FIG. 3 that the drop in current amplification after the ion implantation increases in accordance with the concentration of incorporated alien atoms. This impairment arises as a result of a partial disturbance of the crystal lattice during the ion implantation. To overcome these disturbances and to produce a reduction in the surface recombination due to the hydrogen, it is necessary to subject the individual specimens to temperature treatments.

This temperature treatment was carried out in dry nitrogen for 30 minutes commencing at 230°C in steps, the current amplification being measured after each temperature step. It will be seen from FIG. 3 that the temperatures at which the transistors are treated decrease in accordance with the increase in concentration of the alien substances. For the production of transistors having overlapping nitride layers and a good current amplification with a low collector current, it is desirable to use an ion concentration of approximately $3 \cdot 10^{15}$ atoms per square centimeter with a subsequent temperature treatment between 400° and 500°C.

It should be evident that various modifications can be made to the described embodiments without departing from the scope of the present invention.

We claim as our invention:

1. A method for doping a silicon dioxide layer located on a semiconductor body which comprises covering the exposed surfaces of said silicon dioxide layer with a layer of silicon nitride and then implanting hydrogen in said silicon dioxide layer by ion implantation through said second insulating layer, the hydrogen implantation being confined to said silicon dioxide layer.

2. The method of claim 1 in which the thickness of the silicon nitride layer is about 1,200 Angstroms and the silicon dioxide layer has a thickness of about 6,000 Angstroms.

3. The method of claim 2 in which hydrogen ions are implanted in said silicon dioxide layer with an energy of about 70keV.

4. The method of claim 1 in which the silicon nitride layer overlaps the edges of the silicon dioxide layer by about 10 microns.

5. The method of claim 1 in which the ion implantation is followed by a high temperature treatment.

6. The method of claim 5 in which said high temperature treatment is carried out at about 400° to 500°C.

7. The method of claim 1 in which the concentration of ions in the silicon dioxide layer amounts to approximately $3 \cdot 10^{15}$ atoms per square centimeter.

8. The method of claim 1 in which said ion implantation results in the production of a silicon planar transistor.

* * * * *